United States Patent [19]
Bird et al.

[11] Patent Number: 5,569,908
[45] Date of Patent: Oct. 29, 1996

[54] CHARGE STORAGE DEVICE HAVING SHARED CONDUCTORS

[75] Inventors: Neil C. Bird, Horley; Gerard F. Harkin, London, both of England

[73] Assignee: U.S. Philips Corporation, New York, N.Y.

[21] Appl. No.: 398,318

[22] Filed: Mar. 3, 1995

[30] Foreign Application Priority Data

Mar. 3, 1994 [GB] United Kingdom ............ 9404113

[51] Int. Cl.$^6$ ............................................. H01L 27/00
[52] U.S. Cl. ................... 250/208.1; 358/483; 348/311
[58] Field of Search ........................ 250/208.1, 208.2; 358/482, 483; 348/294, 311

[56] References Cited

U.S. PATENT DOCUMENTS

| | | | |
|---|---|---|---|
| 4,541,015 | 9/1985 | Itoh et al. | 358/212 |
| 4,565,928 | 1/1986 | Yamamoto et al | 250/578 |
| 4,948,966 | 8/1990 | Arques et al. | 250/208.1 |
| 5,376,782 | 12/1994 | Ikeda et al. | 250/208.1 |
| 5,410,349 | 4/1995 | Tanigawa et al. | 348/311 |
| 5,426,292 | 6/1995 | Bird et al. | 250/208.1 |

FOREIGN PATENT DOCUMENTS 0233489  8/1987  European Pat. Off. .

Primary Examiner—Edward P. Westin
Assistant Examiner—Stephen Calogero
Attorney, Agent, or Firm—Steven R. Biren

[57] ABSTRACT

The storage elements (3) of an array (2) are arranged in rows and columns with the storage elements (3) in a column being coupled to a first conductor (4) and the storage elements (3) in a row being coupled to a second (5) and to a third (6) conductor. Each storage element (3) in a row is coupled to the associated second conductor (5) by a first rectifying element (D1) and to the associated third conductor (6) by a second rectifying element (D2) with the first and second rectifying elements (D1 and D2) allowing the passage of current when forward-biased by applied voltages. The third conductors (6) also form the second conductors (5) of any adjacent rows. The first and second rectifying elements (D1' and D2') of alternate rows (N, N+2, N+4, ...) are oppositely oriented to those (D1" and D2") in the remaining rows (N+1, N+3, ...). An arrangement (7) is provided for applying voltages to the second and third conductors (5 and 6) for enabling only the first and second rectifying elements (D1 and D2) associated with a selected row of storage elements (3) to be forward-biased to allow charge stored at the storage elements of the selected row to be read. This allows the problems of incomplete recharging of storage elements (3) to be reduced without having to increase the overall number of conductors.

15 Claims, 8 Drawing Sheets

CHARGE STORAGE DEVICE HAVING SHARED CONDUCTORS

RELATED APPLICATIONS

The present invention is related in subject matter to the following application by the same inventor as, and filed simultaneously with this application:

1) application entitled "Charge Storage Device"—U.S. Ser. No. 08/398,320; and 2) application entitled "An Imaging Device"—U.S. Ser. No. 08/398,324.

BACKGROUND OF THE INVENTION

1. Field of the Invention

This invention relates to a charge storage device and to a method of operating such a device.

2. Description of the Related Art

FIG. 1 of the accompanying drawings shows an example of a pixel 101 of a known charge storage device in the form of an image sensor 100. Generally, the image sensor 100 will comprise a two-dimensional matrix of N rows and M columns M of pixels with associated row 102 and column 103 conductors. However, in the interests of convenience, only one pixel is illustrated in FIG. 1.

The pixel 101 comprises a photosensitive diode PD and a switching diode SD coupled in series between the associated row conductor 102 and associated column conductor 103. In the example shown, the switching diode SD and photosensitive diode PD are arranged with the cathodes coupled together. A capacitor C is shown coupled across the photosensitive diode D. This capacitor C may be the parasitic capacitance of the photosensitive diode PD or may be an additional capacitor added to increase the dynamic range of the image sensor 100.

Each column conductor 103 is coupled to a suitable charge sensitive amplifier 104 having a capacitive coupling between its input and its output.

Such image sensors suffer from image lag resulting from the non-linear forward resistance of the switching diode SD which causes the resistance of the switching diode SD to increase as the voltage across the diode drops. Thus, light falling on the photosensitive diode PD of the pixel 101 causes the capacitance C of the photosensitive diode PD to be discharged. When an appropriate voltage $V_R$ is applied to the associated row conductor 102 to forward bias the switching diode SD, a current starts to flow to recharge the photosensitive diode PD capacitance C enabling the charge stored at the photosensitive diode PD to be integrated by the charge sensitive amplifier 104. However, as the voltage across the photosensitive diode PD rises, the voltage across the switching diode SD decreases and so the forward resistance of the switching diode SD increases. The rate of charging of the photosensitive diode capacitance C thus slows down and at the end of the readout period, the photosensitive diode capacitance C will not have been completely recharged. The row voltage $V_R$ falls at the end of the readout pulse and the switching diode SD again becomes reverse-biased. Even when light does not fall on the photosensitive diode PD in the integration period between readout pulses, when the next readout pulse is applied to the row conductor 102, the switching diode SD is again forward-biased because charging of the photosensitive diode capacitance C was not completed during the previous readout pulse. A small amount of current thus flows and the photosensitive diode capacitance C is charged a little more. This process repeats for the next few readout pulses with, each time, the amount of charging becoming a little smaller.

FIG. 2a illustrates graphically the change in the row voltage $V_R$ with time and shows the application of four sequential readout pulses $R_0$, $R_1$, $R_2$ and $R_3$ at times $t_0$, $t_1$, $t_2$ and $t_3$, respectively for the situation where no light has fallen on the pixel since just before the first readout pulse. FIG. 2b illustrates the change in the voltage $V_X$ across the photosensitive diode capacitance C for the time period within which the four row voltage pulses are sequentially applied. As can be clearly seen from FIG. 2b, although no light has fallen on the photosensitive diode PD since before the first row voltage pulse $R_O$, the capacitance of the photosensitive diode PD is not fully recharged during the first readout pulse $R_O$ and is recharged a little more during the following readout pulses $R_1$, $R_2$ and $R_3$. The current that flows is integrated by the charge sensitive amplifier 104. FIG. 2c illustrates the change in voltage of the output of the charge sensitive amplifier 104 over the time scale of the four readout pulses $R_0$ to $R_3$ with the times $t_0$, $t_1$, $t_2$ and $t_3$ representing the commencement of the application of the corresponding readout pulses $R_0$, $R_1$, $R_2$ and $R_3$. Instead of the output voltage $V_O$ dropping from a high voltage $V_H$ to a low voltage $V_L$ at the end of the first readout pulse $R_O$ as indicated by the dashed line a in FIG. 2c, the voltage $V_O$ has, as indicated by the solid line b, a much slower transition towards the low voltage $V_L$, because, as explained above, the photosensitive diode capacitance C continues to charge during readout pulses following the first readout pulse $R_O$ after the illumination has been removed. Accordingly, there is a "lag" in the sensed image which means that any moving or changing image may appear blurred.

EP-A-233489 describes a charge storage device comprising an array of storage elements for storing charge, the storage elements being arranged in rows and columns with the storage elements in a column being coupled to a first conductor and the storage elements in a row being coupled to a second and to a third conductor, each storage element in a row being coupled to the associated second conductor by a first rectifying or isolation element and to the associated third conductor by a second rectifying or isolation element with the first and second rectifying elements allowing the passage of current when forward-biassed by applied voltages.

As described in EP-A-233489, the storage elements comprise photosensitive diodes while the first and second rectifying elements comprise switching diodes. In operation of the device, appropriate voltages are applied to the respective second and third conductors associated with a row of storage elements to reverse-bias the associated first and second rectifying elements when charge is to be stored at the charge storage elements of a row and to forward-bias the associated first and second rectifying elements when charge is to be read from the charge storage elements of a row.

EP-A-233489 thus replaces the switching diode or rectifying element SD with two rectifying elements coupled in series between two row conductors and couples the photosensitive diode PD to a junction between the two rectifying elements. The pixel is then read out by applying voltages to the row conductors that will forward-bias both of the rectifying elements or switching diodes so that a current flows through the two switching diodes defining a voltage at the junction which, if the two diodes are identical, will be equal to the average of the voltages applied to the two row conductors. In operation of such a charge storage device, when a pixel has just been read out and the capacitance of the photosensitive diode has been charged, the switching diodes are reverse-biased by applying appropriate voltages to the two row conductors. As light falls on the photosensitive diode PD, charge will be produced and the voltage across the photosensitive diode PD will fall. When the next readout pulse is applied to the two row conductors to forward-bias the switching diode, current will flow through the photosensitive diode capacitance C until the average of the voltages of the two row conductors is reached. Thus, the photosensitive diode capacitance C can be completely recharged within the corresponding readout pulse and there is accordingly little or no lag.

However, the charge storage device illustrated in EP-A-233489 requires two row conductors for each row of charge storage elements which necessarily increases the amount of area within the device which must be taken up by the conductors and, moreover, requires a greater number of connections between conductors and corresponding driving circuits for applying voltages to the row and column conductors.

The increased number of row conductors inevitably increases the area occupied by conductors within the device at the expense of the area available to the storage elements. This may be of particular disadvantage where the charge storage device is an image sensor and the image sensor needs to be as transparent as possible to enable, for example, a display such as a CRT (Cathode Ray Tube) or LCD (Liquid Crystal Device) display to be viewed through the image sensor or where it is desirable to have as large a photosensitive area as possible, for example where the device is an image sensor for use in X-ray diagnostics.

SUMMARY OF THE INVENTION

According to a first aspect of the present invention, there is provided a charge storage device comprising an array of storage elements for storing charge, the storage elements being arranged in rows and columns with the storage elements in a column being coupled to a first conductor and the storage elements in a row being coupled to a second and to a third conductor, each storage element in a row being coupled to the associated second conductor by a first rectifying element and to the associated third conductor by a second rectifying element with the first and second rectifying elements allowing the passage of current when forward-biassed by applied voltages, characterized in that the third conductor of each row of storage elements also forms the second conductor of any adjacent rows of storage elements, in that the first and second rectifying elements associated with storage elements in alternate rows are oppositely oriented to the first and second rectifying elements associated with storage elements in the remaining rows so that when forward-biassed the first and second rectifying elements associated with storage elements in the said alternate rows allow current to flow in one direction between the second and third conductors while when forward-biassed the first and second rectifying elements associated with storage elements in the remaining rows allow current to flow in the opposite direction between the second and third conductors and in that means are provided for applying voltages to the second and third conductors for enabling only the rectifying elements associated with a selected row of charge storage elements to be forward-biassed to allow charge stored at the storage elements of the selected row to be read.

It should be understood that, as used herein, the term "rectifying element" means any element which has an asymmetric characteristic and passes as low a current as possible in one direction (the reverse direction) and the required current in the other direction (the forward direction).

Thus, in a device in accordance with the present invention, the problems of incomplete recharging of charge storage elements may be reduced without having to increase the overall number of conductors associated with the rows of storage elements.

The storage elements may each compose a photosensitive element for, in one mode of operation, storing charge in response to light incident on the photosensitive element.

The photosensitive elements may comprise photosensitive diodes, for example p-i-n photosensitive diodes formed by thin film technology.

The rectifying elements may comprise diodes which may be formed by thin film technology.

One of the rectifying elements associated with each storage element may also comprise a photosensitive element and the rectifying elements and storage elements may be arranged so as to reduce leakage current from a storage element during the reading out of charge from another storage element in the same column of storage elements.

In one example, the storage and rectifying elements comprise junction diodes and the storage elements and one of the first and second rectifying elements associated with each storage element are photosensitive, the rectifying elements and storage elements being arranged so that, for each storage element and the associated first and second rectifying elements:

$$(C_x + C_y)I_P = C_P I_D$$

where $C_x$, $C_y$ and $C_P$ are the intrinsic capacitances of the photosensitive rectifying element, the other rectifying element and the photosensitive storage element, respectively, and $I_P$ and $I_D$ are the currents generated by light incident on the photosensitive storage element and the photosensitive rectifying element, thereby reducing leakage current from a storage element during the reading out of charge from another storage element in the same column of storage elements.

In such an example, for each storage element, the associated rectifying elements may have a given area and the storage element and the photosensitive rectifying element a second given area which is exposed to incident light with the respective areas of the rectifying and storage elements being such that:

$$\left(\frac{A_{CD1}}{2A_{DD1}}\right) = \left(\frac{A_{C3}}{A_{D3}}\right)$$

where $A_{D3}$ and $A_{DD1}$ are the areas of a storage element and the associated rectifying elements, respectively, while $A_{C3}$ and $A_{CD1}$ are the second given areas of a storage element and the associated photosensitive rectifying element, respectively, which are exposed to incident light.

The means for applying voltages to the second and third conductors for enabling only the rectifying elements associated with a selected row of charge storage elements to be forward-biassed to allow charge stored at the storage elements of the selected row to be read may compose a first voltage supplying means for supplying voltages to the second conductors and a second voltage supplying means for supplying voltages to the third conductors. This should enable voltage supplying means which are only capable of providing two different voltages to be used.

There is also provided a method of operating a device in accordance with the first aspect of the invention, which method comprises sequentially reading charge stored at each charge storage element of a column by applying a first voltage to one and a second voltage to the other of the second and third conductors associated with the selected row containing the charge storage element to be read to forward-bias the associated first and second rectifying elements, applying a third voltage to any second conductor adjacent the said other second conductor of the selected row and a fourth voltage to any second conductor adjacent the said one second conductor of the selected row to reverse-bias the first and second rectifying elements associated with the or each row of charge storage elements adjacent the selected row and applying the second and third voltages to alternate ones of the remaining second conductors to reverse-bias the first and second rectifying elements associated with the remaining rows of charge storage elements.

In one example, the second voltage is ground, the first voltage is positive with respect to the second voltage, the third voltage is negative with respect to the second voltage and the fourth voltage is positive with respect to the first voltage. Other drive schemes may be possible.

BRIEF DESCRIPTION OF THE DRAWINGS

Embodiments of the present invention will now be described, by way of example, with reference to the accompanying drawing, in which.

It should of course be understood that the drawings are not to scale and that like reference numerals are used throughout text to refer to like parts.

DETAILED DESCRIPTION OF THE PREFERRED EMBODIMENT

Figure 1:
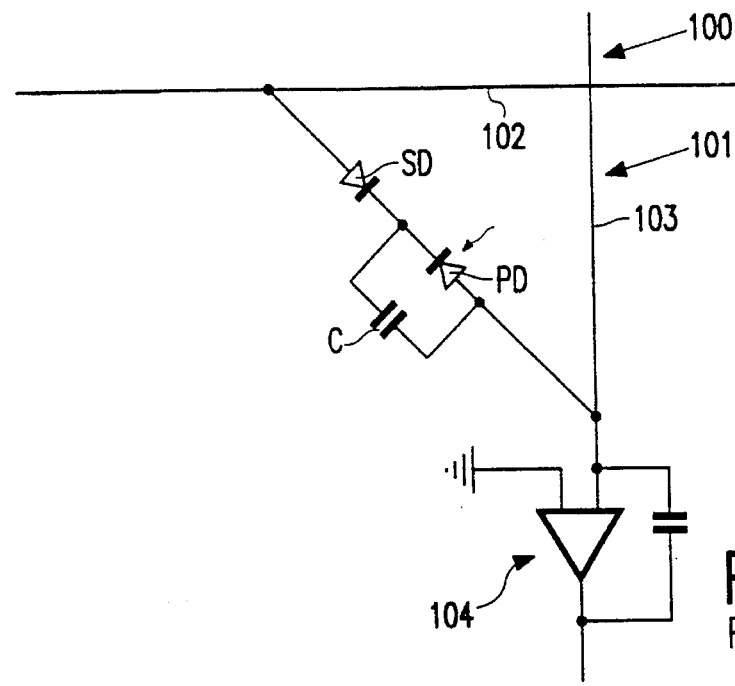
FIG. 1 is a very simple circuit diagram of one pixel of a known charge storage device.
Figure 2A:
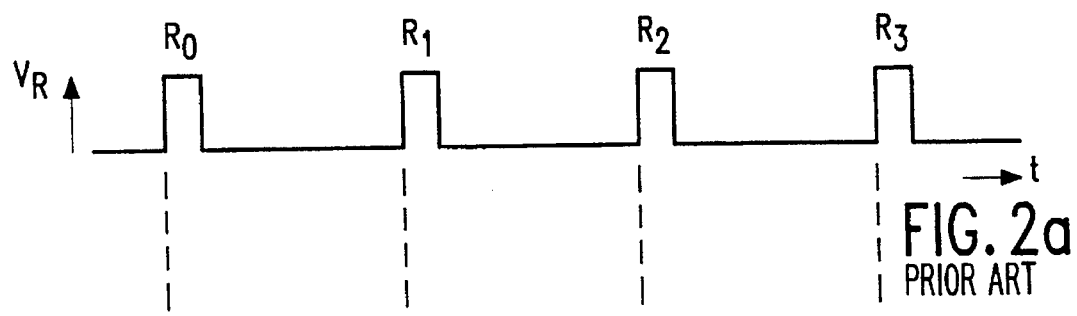
FIGS. 2a, b and c illustrate graphically the operation of the known charge storage device.
Figure 2B:
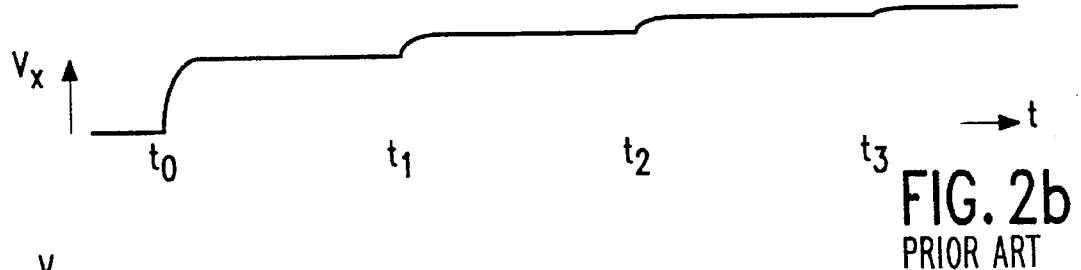
Figure 2C:
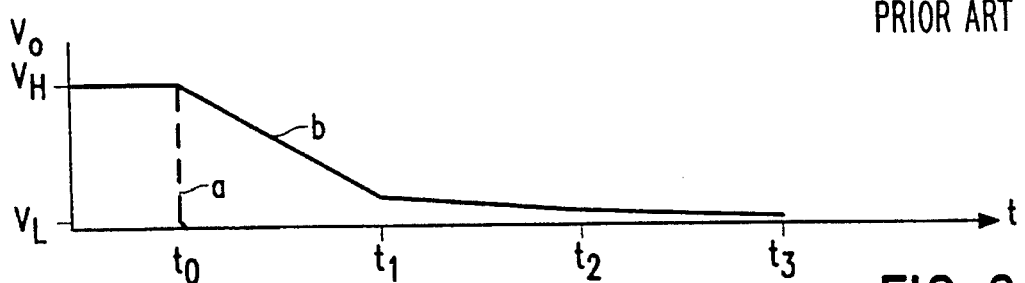

Referring now to FIGS. 3 to 8 of the drawings, there is illustrated a charge storage device 1 comprising an array 2 of storage elements 3 for storing charge, the storage elements 3 being arranged in rows and columns with the storage elements 3 in a column being coupled to a first conductor 4 and the storage elements 3 in a row being coupled to a second 5a, 5b and to a third 6a, 6b conductor, each storage element 3 in a row being coupled to the associated second conductor 5a, 5b by a first rectifying element D1 and to the associated third conductor 6a, 6b by a second rectifying element D2 with the first and second rectifying elements D1 and D2 allowing the passage of current when forward-biased by applied voltages.

In accordance with the invention, the third conductor 6a, 6b of each row of storage elements 3 also forms the second conductor 5a, 5b of any adjacent rows of storage elements 3, the first and second rectifying elements D1' and D2' associated with storage elements 3a in alternate rows N−2, N, N+2, N+4, . . . (N+2n, where n is an integer) are oppositely oriented to the first and second rectifying elements D1" and D2" associated with storage elements 3b in the remaining rows N−1, N+1, N+3, N+5 . . . (N+(2n−1), where n is an integer) so that when forward-biased the first and second rectifying elements D1' and D2' associated with charge storage elements 3a in the said alternate rows N, N+2, N+4 . . . allow current to flow in one direction between the second and third conductors 5a and 6b while when forward-biased the first and second rectifying elements D1" and D2" associated with storage elements 3b in the remaining rows N+1, N+3 . . . allow current to flow in the opposite direction between the second and third conductors 5b and 6a and means 7 are provided for applying voltages to the second and third conductors 5a, 5b and 6a, 6b for enabling only the first and second rectifying elements D1 and D2 associated with a selected row of storage elements 3 to be forward-biased to allow charge stored at the storage elements of the selected row to be read.

Thus, in a device in accordance with the present invention, the problems of incomplete recharging of storage elements 3 may be reduced without having to increase the overall number of conductors associated with the rows of storage elements 3.

Figure 3:
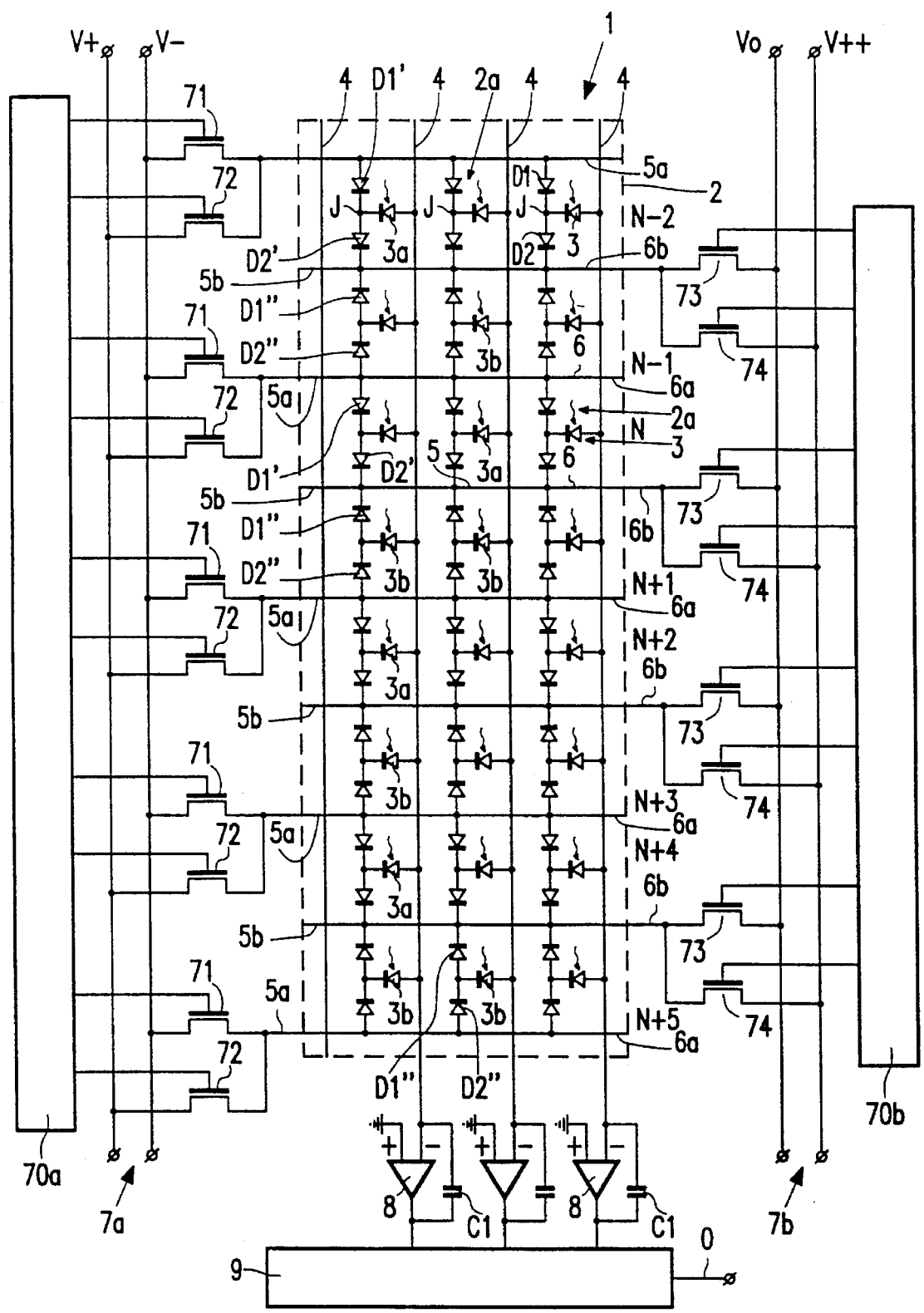
FIG. 3 is a schematic circuit layout for a charge storage device in accordance with the invention, which charge storage device is in the example shown an image sensor.

FIG. 3 is a schematic layout diagram of one example of a charge storage device 1 in accordance with the invention. In this example, the charge storage device 1 is an image sensor.

The image sensor 1 comprises an array 2 of pixels 2a arranged in rows and columns. The border of the array 2 is illustrated by a dashed line in FIG. 3. Although only an array of three columns and eight rows of pixels 2a is shown in FIG. 3, it will be appreciated by those skilled in the art that the array may generally comprise a much larger number of rows and columns of pixels 2a.

Each pixel 2a comprises a photosensitive diode 3 coupled between an associated first or column conductor 4 and a junction J between associated first and second switching diodes D1 and D2. The switching diodes D1 and D2 are coupled in series between the associated second and third conductors 5 and 6.

The switching diodes D1' and D2' in alternate rows N−2, N, N+2, N+4 . . . (N+2n) are oriented so that the anodes of the first switching diodes D1' are coupled to the associated second conductor 5a while the cathodes of the switching diodes D2' are coupled to the associated third conductor 6b. The switching diodes D1" and D2" associated with the remaining rows N−1, N+1, N+3 . . . (N+(2n−1)) of pixels 2a are oppositely oriented to the switching diodes D1' and D2' so that the cathodes of the switching diodes D1" are coupled to the associated second conductor 5b while the anodes of the second switching diodes D2" are coupled to the associated third conductor 6a.

In each of the pixels 2a, the photosensitive diodes 3 are oriented so that the cathode of each photosensitive diode 3 is coupled to the junction J between the corresponding first and second switching diodes D1 and D2. As is clearly evident from FIG. 3, the third conductor 6b of the Nth row of pixels 2a forms the second conductor 5b of the N+1 row of pixels 2a while the third conductor 6a of the N+1 row of pixels 2a forms the second conductor 5a of the N+2 row of pixels 2a.

In the example illustrated in FIG. 3, first and second driving circuit arrangements 7a and 7b are provided for supplying the appropriate voltages to the conductors 5 and 6. The first driving circuit arrangement 7a is arranged to supply the appropriate voltages to alternate conductors 5a, 6a while the second driving circuit arrangement 7b is arranged to supply appropriate voltages to the remaining conductors 5b, 6b.

Each of the row conductors 5a, 6a is coupled to voltage supply lines V+ and V− via respective switching transistors 71 and 72. The gate or control electrodes of the switching transistors 71 and 72 are coupled to a shift register and decoder circuit 70a. The second row driving circuit 7b similarly comprises switching transistors 73 and 74 coupling the row conductors 5b, 6b to voltage supply lines Vo and V++, respectively, and having their control or gate electrodes coupled to a shift register and decoder circuit 70b. The shift register and decoder circuits 70a and 70b are arranged to activate the appropriate transistors 71 to 74 under the control of clock signals in known manner to allow the appropriate voltage signals to be applied to the row conductors 5 and 6 at the appropriate times.

The column conductors 4 are each coupled via a respective charge sensitive amplifier 8 of known form to an output shift register and decoder circuit 9 from which image signals may be supplied by an output O to an appropriate store or to a display, neither of which is shown.

Each charge sensitive amplifier 8 has its output coupled to its negative input via a capacitor C1 and serves to convert a current supplied through the associated column conductor 4 during readout of stored charge into a voltage output. The positive inputs of the charge sensitive amplifiers 8 are coupled to ground or any suitable fixed reference potential. The fixed reference potential is effectively determined by the row voltages because the photosensitive diodes must always be reverse-biased.

Although the image sensor 1 may be of any suitable construction, in this example the image sensor 1 is formed using thin film technology on a suitable insulative substrate. Of course, where it is required for light to be capable of passing through the image sensor 1, then the substrate should be transparent to that light.

The row driver arrangements 7a, 7b, charge sensitive amplifiers 8 and output shift register and decoder circuit 9 may be formed on separate substrates from (or around the periphery) of the array 2 and may, for example, be in the form of polycrystalline film transistor circuitry.

Figure 4:
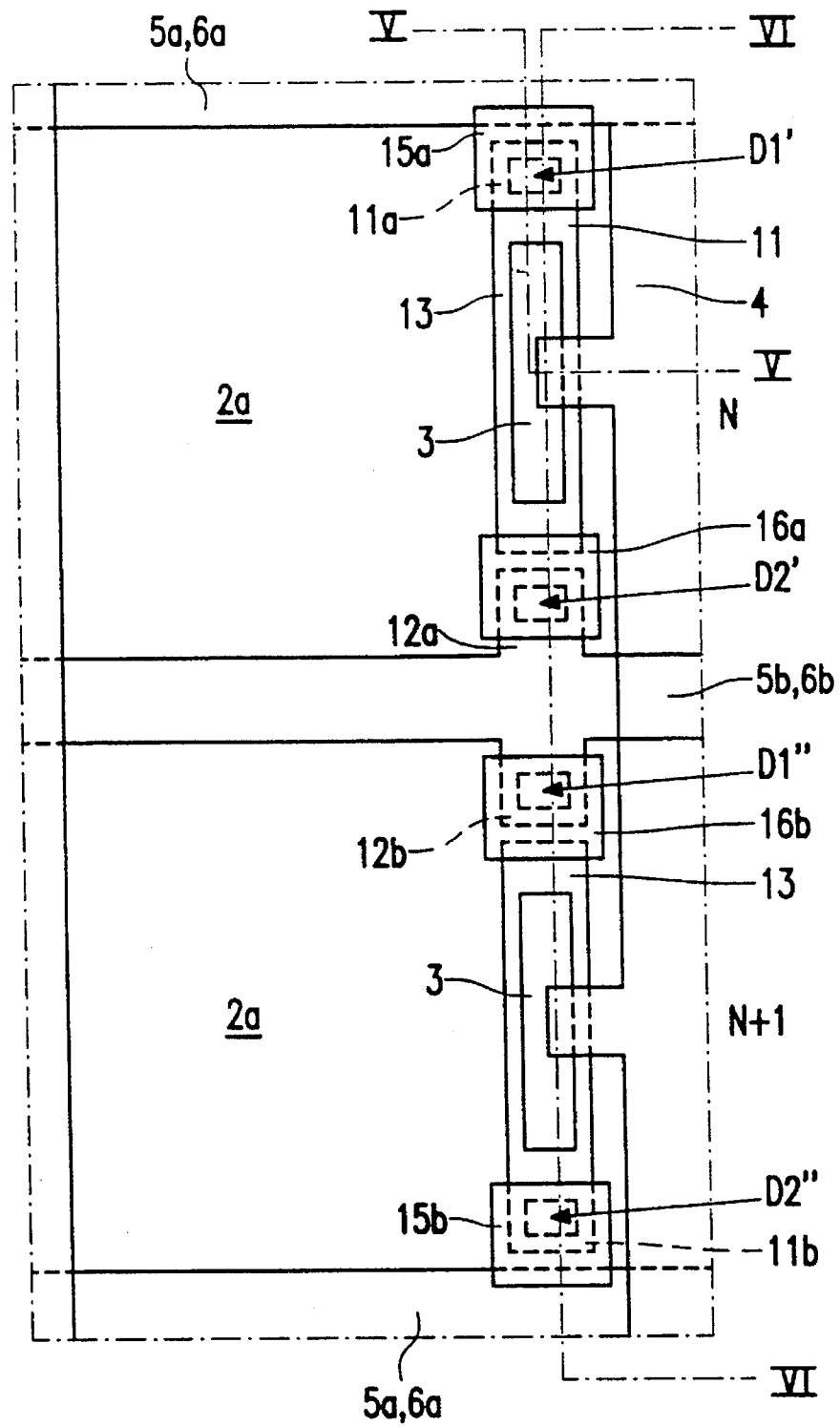
FIG. 4 shows a plan view of part of an image sensor in accordance with the invention illustrating one possible layout.
Figure 5:
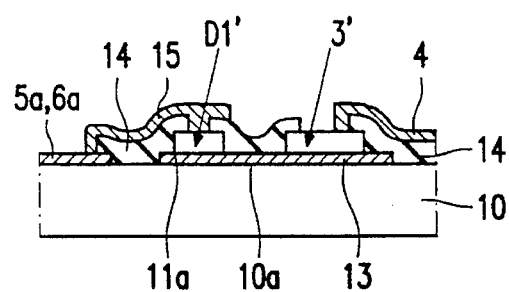
FIG. 5 is a cross-sectional view taken along the line V—V in FIG. 4.
Figure 6:
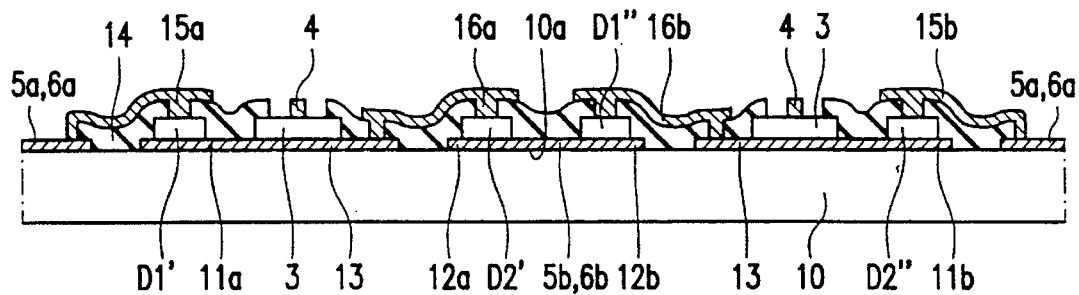
FIG. 6 is a cross-sectional view taken along the line VI—VI in FIG. 4.

FIGS. 4 shows one pixel of each of adjacent rows N and N+1 of one possible schematic layout for one example of the image sensor shown in FIG. 3 while FIG. 5 illustrates a cross-sectional view taken along the line V—V in FIG. 4 of a pixel 2a in the Nth one of the rows and FIG. 6 illustrates a cross-sectional view taken along the line VI—VI of the two pixels 2a of the N and N+1 rows and in the same column.

As indicated above, in this example, the image sensor 1 is formed by thin film technology on an insulative, generally transparent, substrate 10 which may be formed of a suitable glass or plastics material.

A first electrically conductive layer, generally a chromium layer, is deposited on to the insulative substrate 10 and defined to form at least part of the row conductors 5, 6, the cathode electrodes 11a and 11b of the first switching diodes D1' and second switching diodes D2", the cathode electrodes 12a and 12b of the second switching diodes D2' and first switching diodes D1" and the cathode electrodes 13 of the photosensitive diodes 3. As shown in FIGS. 4 to 6, the cathode electrodes 11a and 11b are formed integrally with the cathode electrode 13 of the associated photosensitive diode 3 while the cathode electrodes 12a and 12b are formed integrally with at least part of the associated row conductor 5b, 6b.

In this example, the photosensitive diodes 3 and the switching diodes D1 and D2 are formed as amorphous silicon n-i-p diodes by depositing in sequence n conductivity, intrinsic conductivity and p conductivity amorphous silicon layers. These layers are then patterned to define the diode structures as shown in FIGS. 5 and 6. In the interests of simplicity, the diode structures are not shown cross-hatched in FIGS. 5 and 6.

An insulating layer, generally a silicon nitride layer, is then deposited and patterned to define dielectric isolation regions 14. A second electrically conductive layer, again generally a chromium layer, is then deposited and patterned to define first interconnects 15a and 15b respectively coupling the anode of each first switching diode D1' and each second switching diode D2" to the associated row conductor 5a, 6a, second interconnects 16a and 16b respectively coupling the cathode of each first switching diode D1' to the anode of the associated second switching diode D2' and the cathode of each second switching diode D2" to the anode of the associated first switching diode D1", and at least part of the column conductors 4. Although not shown, if considered desirable, a protective transparent insulating layer such as a layer of polyimide, may be deposited over the structure.

As is clearly shown in the example of FIG. 4, the layout structure of the pixels 2a of the remaining rows N−1, N+1, N+3 . . . of the image sensor is effectively a mirror image of the pixels 2a of the rows N−2, N, N+2, . . . .

The layout of the image sensor may have any appropriate pattern but, as shown in FIG. 4, the row and column conductors 4 and 5, 6 define a rectangular, generally square grid with the switching diodes D1 and D2 and the photosensitive diodes 3 taking up as little area as possible of the pixels 2a to allow the image sensor to be as transparent as possible enabling the image sensor to be placed on top of something else such as a display without significantly obscuring the display. Of course, where maximum sensitivity is required (for example for X-ray diagnostics equipment), then the areas of the photosensitive diodes 3 should be as large as possible.

The above described structure enables all of the diodes D1, D2 and 3 to be formed as n-i-p rather than p-i-n diodes so enabling all of the diodes to be formed simultaneously. However, if desired, appropriate ones of the diodes may be formed as p-i-n diodes which should simply simplify the interconnection and metallisation patterns. In practice, the most suitable form of diode structure for the particular application will be used, it being borne in mind that generally n-i-p diodes are better photosensitive diodes than p-i-n diodes while p-i-n diodes are better switching diodes than n-i-p diodes.

Of course, as will be appreciated by the person skilled in the art, the switching diodes D1 and D2 differ from the photosensitive diodes 3 in that the anode and cathode electrodes of the switching diodes shield the diodes from any incident light whereas the photosensitive diodes 3 are, of course, as shown in FIGS. 5 and 6, exposed by incident on the anode side of the photosensitive diode 3.

Figure 7:
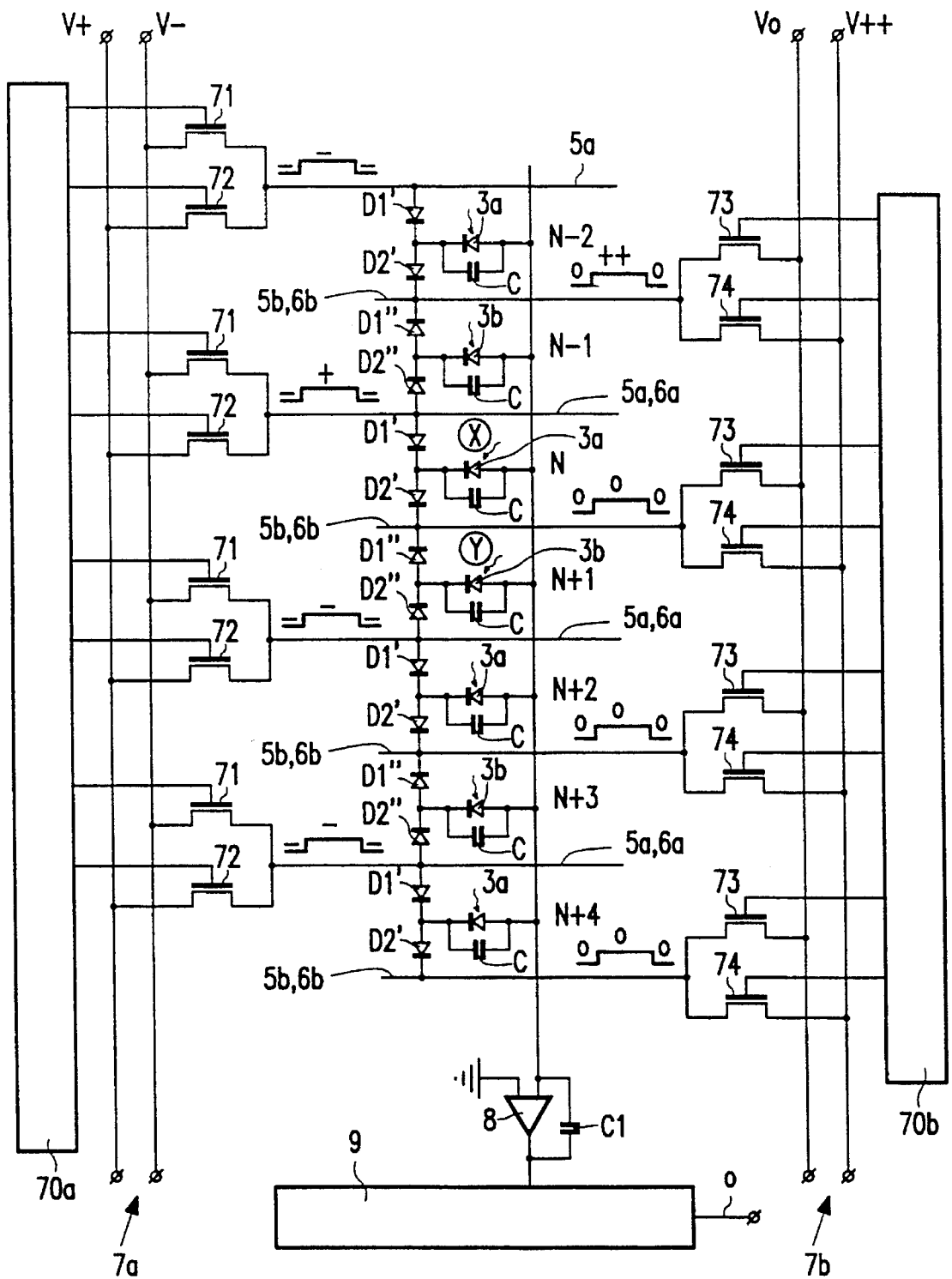
FIGS. 7 and 8 are schematic diagrams each showing part of an image sensor in accordance with the invention for illustrating the operation of the device.

The operation of the image sensor described above will now be explained with reference to FIGS. 7 and 8 which each show part of the image sensor and indicate the voltages applied during read out of a pixel. FIG. 7 shows the situation where a pixel X in row N is being read out while FIG. 8 shows the situation where a pixel Y in row N+1 is being read out.

Referring first to FIG. 7, in order to read out charge previously stored at a pixel X in row N, the first or left row driving circuit 70a renders conducting the transistors 71 coupled to the row conductors 5a of the pixel rows N−2, N+2, N+4, ... and the transistor 72 coupled to the row conductor 5a of the pixel row N. Thus, the row conductor 5a of the pixel row N is coupled to the voltage supply line V+ while the row conductors 5a of the pixel rows N−2, N+2, N+4, ... (N+2n, where n≠0) are coupled to the voltage supply line V−. At the same time, the second or right row driving circuit 70b renders conducting the transistors 73 coupled to the row conductors 5b of the pixel rows N+1, N+3, N+5, ... (N+(2n−1), where n≠0) and the transistor 74 coupled to the row conductor 5b of the pixel row N−1. Thus, the row conductor 5b of the pixel row N−1 is coupled to the voltage supply line V++ while the row conductors 5b of the pixel rows N+1, N+3, N+5, ... are coupled to the voltage supply line Vo. The voltage V++ is more positive than the voltage V+ which is itself more positive than the voltage Vo which is more positive than the voltage V−.

The switching diodes D1 and D2 of the pixels 2a in the pixel row N are thus forward-biased while the switching diodes D1 and D2 of the pixels 2a of the pixel rows except the row N are reverse-biased. Current will flow through the photosensitive diode capacitances C of the pixels of the pixel row N to be integrated by the associated charge sensitive amplifier 8 which supplies an output signal to the output shift register and decoder circuit 9 from which image signals may be supplied by an output O to an appropriate store or to a display, neither of which is shown. Current flows through the photosensitive diode capacitances C of the pixels of the pixel row N until the average of the voltages of the two associated row conductors is reached. Thus, the photosensitive diode capacitance C can be completely recharged within the corresponding readout pulse and there is accordingly no, or at least considerably reduced, lag.

Figure 8:
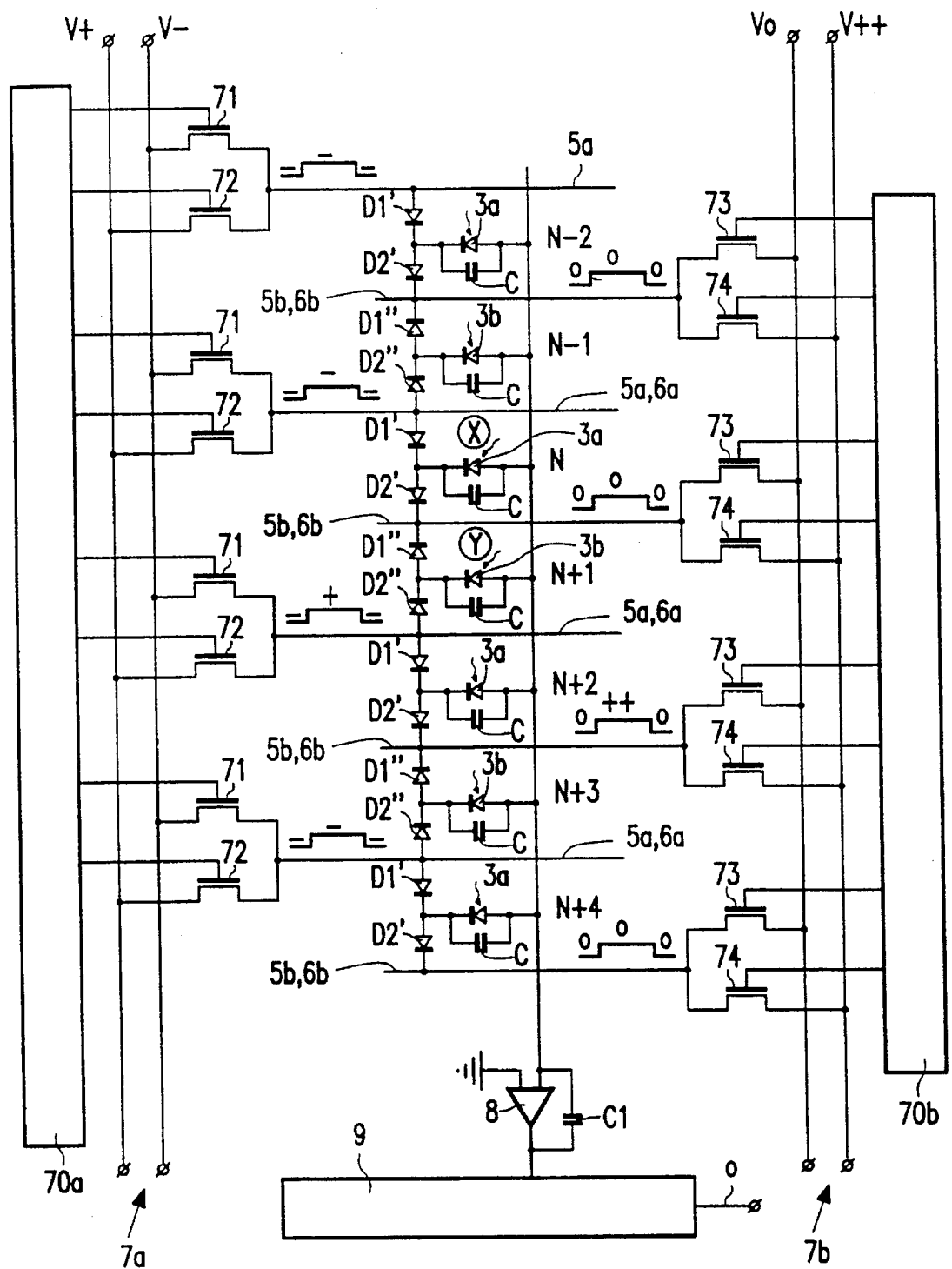

In order to read out charge previously stored at a pixel Y in row N+1, as illustrated in FIG. 8, the first or left row driving circuit 70a renders conducting the transistors 71 coupled to the row conductors 5a of the pixel rows N−2, N, N+4, ... (N+2n, where n≠1) and the transistor 72 coupled to the row conductor 5a of the pixel row N+2. Thus, the row conductor 5a of the pixel row N+2 is coupled to the voltage supply line V+ while the row conductors 5a of the pixel rows N−2, N, N+4, ... (N+2n, where n≠1) are coupled to the voltage supply line V−. At the same time, the second or right row driving circuit 70b renders conducting the transistors 73 coupled to the row conductors 5b of the pixel rows N−1, N+1, N+5, ... (N+(2n−1), where n≠2) and the transistor 74 coupled to the row conductor 5b of the pixel row N+3. Thus, the row conductor 5b of the pixel row N+3 is coupled to the voltage supply line V++ while the row conductors 5b of the pixel rows N−1, N+1, N+5, ... are coupled to the voltage supply line Vo.

The switching diodes D1 and D2 of the pixels 2a in the pixel row N+1 are thus forward-biased while the switching diodes D1 and D2 of the pixels 2a of the pixel rows except the row N+1 are reverse-biased. Current will flow through the photosensitive diode capacitances C of the pixels of the pixel row N+1 to be integrated by the associated charge sensitive amplifier 8 which supplies an output signal to the output shift register and decoder circuit 9 from which image signals may be supplied by an output O to an appropriate store or to a display, neither of which is shown.

Again, current flows through the photosensitive diode capacitances C of the pixels of the pixel row N+1 until the average of the voltages of the two associated row conductors is reached so that the photosensitive diode capacitance C can be completely recharged within the corresponding readout pulse and there is accordingly no, or at least considerably reduced, lag.

This means that if the noise associated with the image sensor is low, the image sensor can operate in low-light conditions without excessive lag problems. Also, it should be possible to read the pixels more quickly because the switching diodes D1 and D2 of the selected pixel row are strongly forward biased and are able to recharge the pixel capacitances quickly. Moreover, for a given frame time (that is the time to read out the entire image sensor) the image sensor should exhibit very little vertical cross-talk, that is interference between column conductors, because such cross-talk is a function of the time for which a row is selected and the frame time and in the present case, the row select time can be reduced. In addition, the fact that the number of row conductors is half that of a conventional image sensor such as that shown in FIG. 1 and a quarter that of the device described in EP-A-233489, means that an image sensor in accordance with the present invention is particularly suitable for mounting on a common substrate with other similar image sensors in the manner described in EP-A-555907 because of the resulting larger separation of the row conductors.

In addition, the area available on the image sensor which is not occupied by the conductors is increased so allowing the image sensor to be more transparent where that is desirable, for example where the image sensor is to be mounted over a display. As an alternative, this allows the photosensitive elements to be larger which may be especially desirable for X-ray diagnostics applications where light levels may be low and a high sensitivity consequently required.

Each row of pixels may be read in sequence by applying the appropriate voltages to the appropriate row conductors 5,6. When the pixels of a particular row are being read out, the remaining pixels have their associated switching diodes D1 and D2 reverse-biased and accordingly these pixels are in their integration period in which charge resulting from the photo-generation of charge carriers within the photosensitive diode by any light incident on the pixel is stored at the pixel. Thus, the charge stored at a row of pixels during the integration period is read out in the subsequent read out period and the rows of pixels are read out sequentially. The columns may be read out simultaneously or sequentially as desired.

Figure 9:
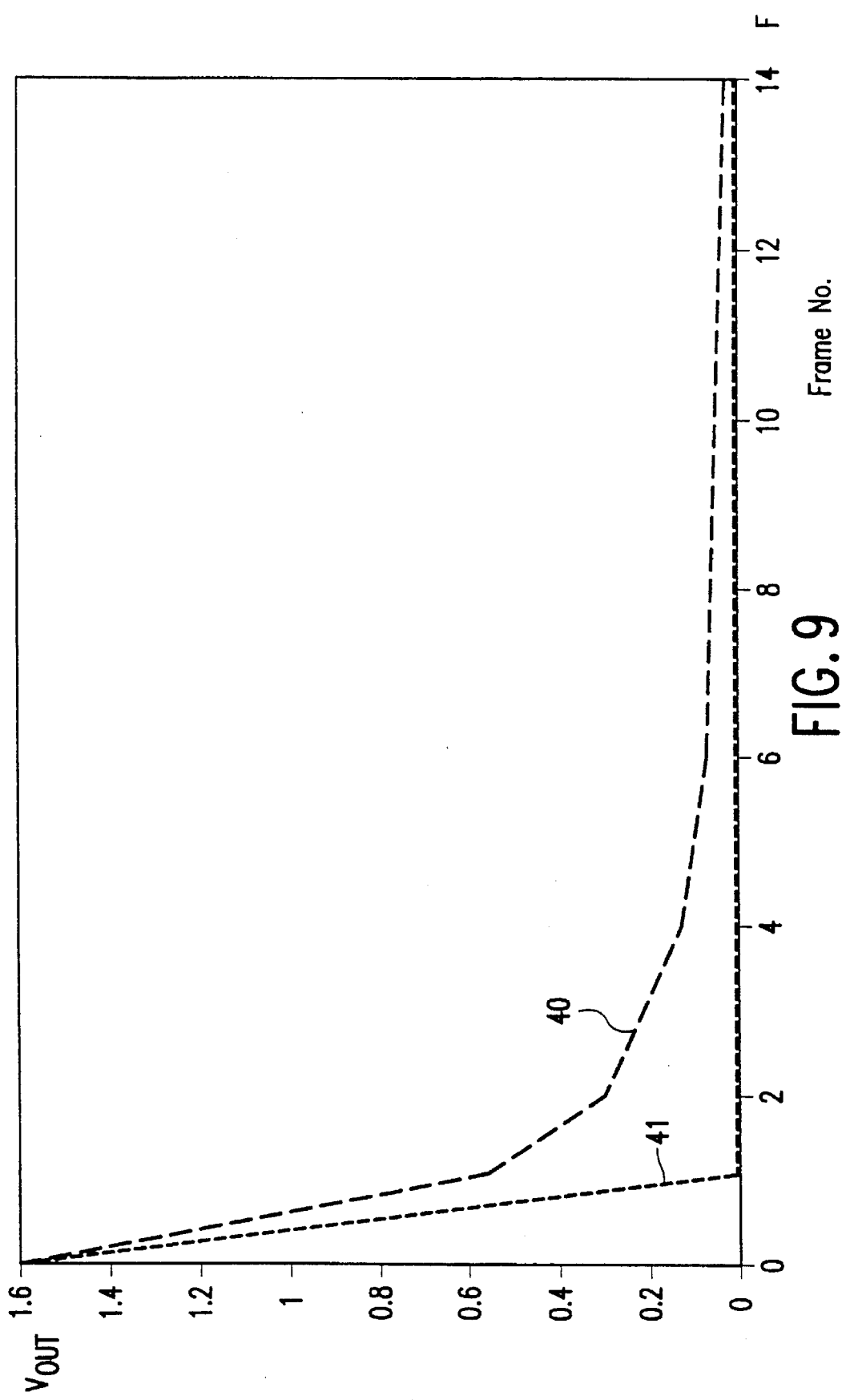
FIG. 9 illustrates graphically the difference in lag characteristics of a pixel of a charge storage device in accordance with the invention and a pixel such as that shown in FIG. 1.

FIG. 9 illustrates graphically the relationship between the output voltage $V_{out}$ of a charge sensitive amplifier 8 and the number of frames or readout pulses F applied to a given pixel which has only been illuminated during the integration period immediately preceding the first readout pulse or frame 1. The bold dashed line 40 shows the results for a pixel of the type shown in FIG. 1 and clearly indicates the existence of lag while the dashed line 41 shows the results for a pixel of an image sensor in accordance with the invention and shows very little, indeed almost no, lag.

Of course, the device 1 may be other than an image sensor and could be, for example, a memory device or a temperature sensing device and may be formed using any suitable technology in place of the thin film technology described above.

In the examples of image sensors in accordance with the invention described so far, although vertical cross-talk should be much reduced compared to conventional devices as discussed above, some vertical cross-talk may still arise from unwanted currents flowing down the column conductors 4 from unselected pixels 2a when a selected pixel in the same column is being read out. The result of this vertical cross-talk is that the integrated output from the charge sensitive amplifier 8 for the selected pixel may include contributions from all of the other pixels in that column. The main source of the unwanted column currents is "dynamic leakage" from the unselected pixels in that column. Thus, when a pixel is sensing light, the intrinsic capacitance of the photosensitive diode 3 is being discharged by the photo-generation of charge carriers within the photosensitive diode 3, which in turn means that the voltage across the switching diode D1 is changing. The changing voltage $V_x$ at the midpoint J between the two switching diodes D1 and D2 causes a current $$I = C_D \frac{dV_x}{dt} \quad (1)$$

to flow through the capacitance $C_D$ of the switching diode D1 and hence down the associated column conductor 4 so causing vertical cross-talk. This could have the effect of removing information from an image because, for example, black text on a white background could appear white and so be lost in the background.

Figure 10:
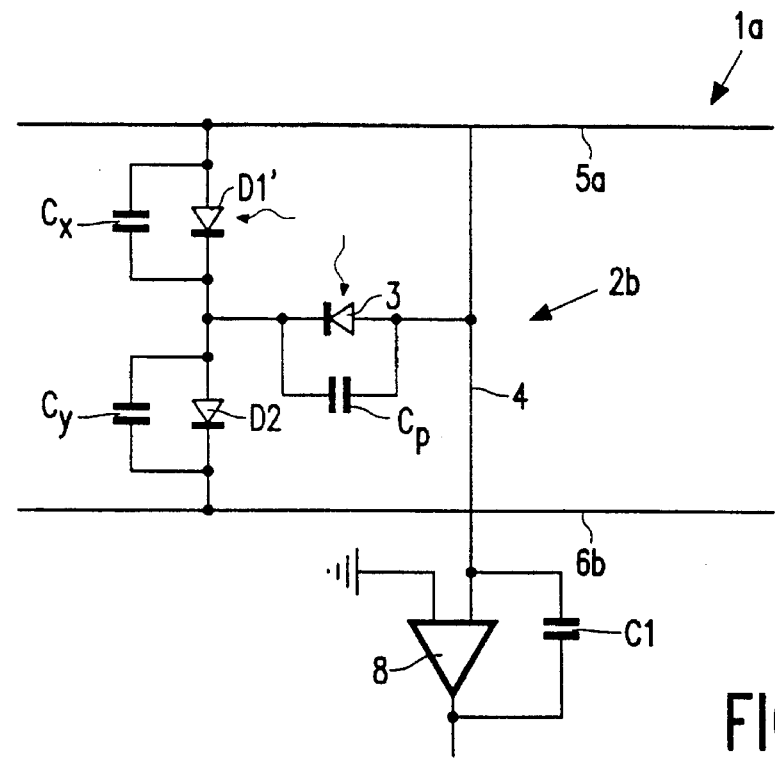
FIG. 10 illustrates a circuit diagram of a pixel of a modified image sensor in accordance with the invention.

FIG. 10 illustrates one pixel 2b of a modified image sensor 1a in accordance with the invention which is designed to eliminate or at least substantially reduce vertical cross-talk. The modified image sensor 1a differs from that discussed above in that the first rectifying elements or diodes D1' and D1" (because only one pixel is shown for the sake of convenience, the first and second rectifying elements or diodes are referred to hereinafter simply as D1 and D2) are formed so as to be photosensitive. This can be achieved by, in the example illustrated by FIGS. 5 and 6, forming the electrodes 15a and 16b so as to have a section which is transparent to the light to be detected. This is most simply achieved by modifying the metallisation-defining mask to provide a contact hole in the electrodes 15a and 16b. The capacitances $C_x$ and $C_y$ shown in FIG. 10 represent the intrinsic capacitances of the diodes D1 and D2, respectively, while the capacitance $C_p$ represents the intrinsic capacitance of the photosensitive diode 3.

Figure 11:
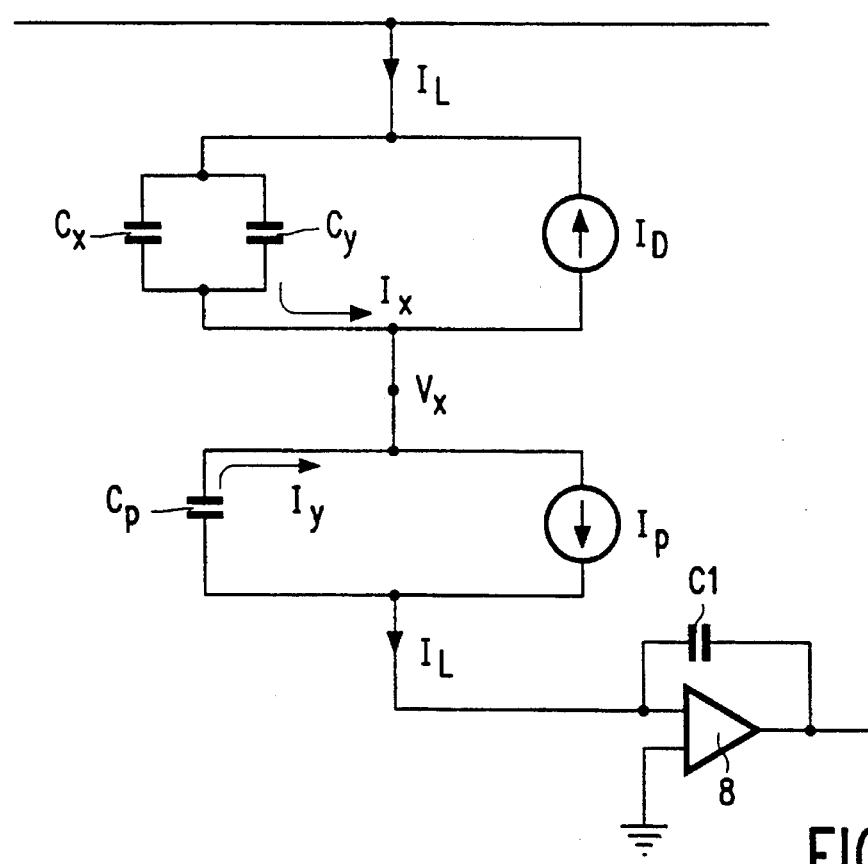
FIG. 11 illustrates an equivalent circuit diagram for the pixel shown in FIG. 10.

FIG. 11 is an equivalent circuit diagram for the pixel 2b shown in FIG. 10. In FIG. 11, the photosensitive switching diode D1 is represented as a source of current $I_D$ in parallel with the capacitance $C_x$ while the photosensitive diode 3 is represented as a current of current $I_p$ in parallel with the capacitance $C_p$. The non-photosensitive switching diode D2 is represented simply as the capacitance $C_y$ in parallel with the capacitance $C_x$ because it of course is not responsive to incident light.

Consider the situation where the pixel 2a is sensing light while another pixel is being read out. From FIG. 11 and using Kirchhoff's Law, then the leakage current $I_L$ flowing down the column conductor 4 from the unselected pixel 2a is:

$$I_P - I_L = I_Y \quad (2)$$

where $I_Y$ is the current flowing through the capacitance $C_p$, and $$I_L + I_D = I_X \quad (3)$$

where $I_x$ is the current flowing through the capacitance $C_x$ also $$I_x = -(C_X + C_Y)\frac{dV_X}{dt} \, , \, I_Y = -C_P \frac{dV_X}{dt} \quad (4)$$

From equations 2, 3 and 4 an expression can be obtained for $I_L$, as follows $$I_L = \frac{(C_X + C_Y)I_P - C_P I_D}{C_P + (C_X + C_Y)} \quad (5)$$

From equation 5, the condition for zero leakage current $I_L$ is:

$$(C_X + C_Y)I_P = C_P I_D \quad (6)$$

Thus if $$\frac{I_P}{C_P} = \frac{I_D}{(C_X + C_Y)} \quad (7)$$

then $I_L$ equals zero and the vertical crosstalk is eliminated.

The photosensitive current $I_{PHOTO}$ is equal to $KA_C$ where K is a constant and $A_C$ is the area of the photodiode which is exposed to light (normally this area is the area of the hole in the opaque electrode or contact of the photodiode, for example the electrode 4 of the photosensitive diode 3 in FIG. 5). Accordingly the condition for no leakage current can be defined by the geometry of the photosensitive diodes D1 and 3. If it is assumed that the switching diodes D1 and D2 are of equal area and the thickness of all three diodes D1, D2 and 3 of a pixel is the same, then, in terms of this geometry, equation 7 becomes:

$$\left( \frac{A_{CD1}}{2A_{DD1}} \right) = \left( \frac{A_{C3}}{A_{D3}} \right)$$

where $A_{DD1}$ and $A_{D3}$ are the areas of the switching diode D1 and photosensitive diode 3, respectively, and are thus proportional to their respective capacitances while $A_{CD1}$ and $A_{C3}$ are the areas of the switching diode D1 and photosensitive diode 3, respectively, exposed to incident light and are so proportional to the photocurrent generated by light incident on the respective diode. As used herein the term "area" in relation to the diodes D1, D2 and 3 means the area of the diode in a plane generally parallel to the diode electrodes, that is, in relation to FIGS. 5 and 6, in a plane parallel to the surface 10a of the substrate 10 upon which the diodes are formed. The thicknesses of the diodes are measured in a direction perpendicular to the surface of the substrate 10.

Accordingly, by appropriately selecting the relative geometries of the diodes D1, D2 and 3, the leakage current from an unselected pixel in the column of the selected pixel will flow internally within the capacitance/photocurrent loop of the diode D1 of that unselected pixel and not through the column conductor 4, so eliminating or at least substantially reducing the vertical cross-talk. Thus, for example, if the areas of the contact holes of the two photosensitive diodes $A_{CD1}$ and $A_{C3}$ are equal, then, for zero vertical cross-talk, the area $A_{D3}$ of the photodiode 3 should be twice that $A_{DD1}$ of the photosensitive switching diode D1.

As will be appreciated by those skilled in the art, other drive schemes may be possible and a single row driver may be used if a suitable source capable of providing four different voltage levels is available. Also, with appropriate reversal of voltages, the photosensitive diodes 3 may be reversed so as to have their anodes connected to the junctions J between the first and second switching diodes D1 and D2.

Also, the row and column conductors need not necessarily extend horizontally and vertically as shown in the drawings. Indeed, the row conductors may extend vertically while the column conductors extend horizontally, that is the device as shown in FIGS. 3 to 7 may be rotated through 90°. Similarly, the row and column conductors need not necessarily be perpendicular to one another, any suitable arrangement may be used.

It should, of course, be understood that the orientations of the diodes may be reversed, although this will of course require appropriate changes in the voltages required to drive the device.

The rectifying elements need not necessarily be diodes but could be any suitable form of, generally two-terminal, element which has an asymmetric characteristic and passes as low a current as possible in one direction (the reverse direction) and the required current in the other direction (the forward direction). Similarly, the photosensitive elements need not necessarily be diodes but could be other types of photosensitive device which pass current only when illuminated. Thus, for example, the photosensitive diodes could be replaced by photoconductors, for example formed of lead oxide, each in series with an appropriate capacitance.

From reading the present disclosure, other modifications and variations will be apparent to persons skilled in the art. Such modifications and variations may involve other features which are already known in the art and which may be used instead of or in addition to features already described herein.

The invention claimed is:

1. A charge storage device comprising an array of storage elements for storing charge, the storage elements being arranged in rows and columns with the storage elements in a column being coupled to a first conductor and the storage elements in a row being coupled to a second and to a third conductor, each storage element in a row being coupled to the associated second conductor by a first rectifying element and to the associated third conductor by a second rectifying element with the first and second rectifying elements allowing the passage of current when forward biased by applied voltages, wherein the third conductor of each row of storage elements also forms the second conductor of any adjacent rows of storage elements, the first and second rectifying elements associated with storage elements in alternate rows are oppositely oriented to the first and second rectifying elements associated with storage elements in the remaining rows so that when forward biased the first and second rectifying elements associated with storage elements in said alternate rows allow current to flow in one direction between the second and third conductors while when forward biased the first and second rectifying elements associated with storage elements in the remaining rows allow current to flow in the opposite direction between the second and third conductors, and means are provided for applying voltages to the second and third conductors for enabling only the rectifying elements associated with a selected row of charge storage elements to be forward biased to allow charge stored at the storage elements of the selected row to be read by stored charge reading means.

2. A charge storage device according to claim 1, wherein the charge storage elements each comprise a photosensitive element for, in one mode of operation, storing charge in response to light incident on the photosensitive element.

3. A charge storage device according to claim 2, wherein the photosensitive elements comprise photosensitive diodes.

4. A charge storage device according to claim 2, wherein one of the rectifying elements associated with each storage element also comprises a photosensitive element and the rectifying elements and storage elements are arranged comprise means for reducing leakage current from a storage element during the reading out of charge from another storage element in the same column of storage elements.

5. A charge storage device according to claim 1, wherein the rectifying elements compose diodes.

6. A charge storage device according to claim 1, wherein the storage and rectifying elements comprise junction diodes with the storage elements and one of the first and second rectifying elements associated with each storage element being photosensitive and the rectifying elements and storage elements are arranged so that, for each storage element and the associated first and second rectifying elements:

$$(C_x+C_y)I_F=C_P I_D$$

where $C_x$, $C_y$ and $C_P$ are the intrinsic capacitances of the photosensitive rectifying element, the other rectifying element and the photosensitive storage element, respectively, and $I_P$ and $I_D$ are the currents generated by light incident on the photosensitive storage element and the photosensitive rectifying element, thereby reducing leakage current from a storage element during the reading out of charge from another storage element in the same column of storage elements.

7. A charge storage device according to claim 6, wherein, for each storage element, the associated rectifying elements have a given area and the storage element and the photosensitive rectifying element have a second given area which is exposed to incident light with the respective areas of the rectifying and storage elements being such that:

$$\left(\frac{A_{CD1}}{2A_{DD1}}\right)=\left(\frac{A_{C3}}{A_{D3}}\right)$$

where $A_{D3}$ and $A_{DD1}$ are the areas of a storage element and the associated rectifying elements, respectively, while $A_{C3}$ and $A_{CD1}$ are the second given areas of a storage element and the associated photosensitive rectifying element, respectively, which are exposed to incident light.

8. A charge storage device according to any one of the preceding claims, wherein the means for applying voltages to the second and third conductors for enabling only the rectifying elements associated with a selected row of charge storage elements to be forward-biassed to allow charge stored at the storage elements of the selected row to be read comprises a first voltage supplying means for supplying voltages to the second conductors and a second voltage supplying means for supplying voltages to the third conductors.

9. A charge storage device according to claim 3 wherein one of the rectifying elements associated with each storage element also comprises a photosensitive element and the rectifying elements and storage elements are arranged to comprise means for reducing leakage current from a storage element during the reading out of charge from another storage element in the same column of storage elements.

10. A charge storage device according to claim 2 wherein the rectifying elements comprise diodes.

11. A charge storage device according to claim 3 wherein the rectifying elements comprise diodes.

12. A charge storage device according to claim 4 wherein the rectifying elements comprise diodes.

13. A charge storage device according to claim 9 wherein the rectifying elements comprise diodes.

14. A method of operating a device which device includes an array of storage elements for storing charge, the storage elements being arranged in rows and columns with the storage elements in a column being coupled to a first conductor and the storage elements in a row being coupled to a second and to a third conductor, each storage element in a row being coupled to the associated second conductor by a first rectifying element and to the associated third conductor by a second rectifying element, said method comprising sequentially reading charge stored at each charge storage element of a column by applying a first voltage to one and a second voltage to the other of the second and third conductors associated with the selected row containing the charge storage element to be read to forward-bias the associated first and second rectifying elements, applying a third voltage to any second conductor adjacent said other second conductor of the selected row and a fourth voltage to any second conductor adjacent said one second conductor of the selected row to reverse-bias the first and second rectifying elements associated with or each row of charge storage elements adjacent the selected row and applying the second and third voltages to alternate ones of the remaining second conductors to reverse-bias the first and second rectifying elements associated with the remaining rows of charge storage elements.

15. A method according to claim 14, wherein the second voltage is ground, the first voltage is positive with respect to the second voltage, the third voltage is negative with respect to the second voltage and the fourth voltage is positive with respect to the first voltage.

* * * * *